(12) United States Patent
Choi et al.

(10) Patent No.: US 8,802,489 B2
(45) Date of Patent: Aug. 12, 2014

(54) DEVICE AND METHOD FOR DEPOSITING ORGANIC MATERIAL

(75) Inventors: Seung-Ho Choi, Yongin (KR); Hyun Choi, Yongin (KR); Sung-Gon Kim, Yongin (KR); Min-Gyu Seo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 218 days.

(21) Appl. No.: 13/187,369

(22) Filed: Jul. 20, 2011

(65) Prior Publication Data

US 2012/0064663 A1      Mar. 15, 2012

(30) Foreign Application Priority Data

Sep. 15, 2010   (KR) ........................ 10-2010-0090598

(51) Int. Cl.
*H01L 51/40*      (2006.01)
(52) U.S. Cl.
USPC .................................... 438/99; 257/E21.461
(58) Field of Classification Search
None
See application file for complete search history.

(56) References Cited

U.S. PATENT DOCUMENTS

| 2003/0211756 A1* | 11/2003 | Ito et al. ........................ 438/782 |
| 2008/0087213 A1* | 4/2008 | Sato et al. ........................ 118/47 |
| 2012/0081455 A1* | 4/2012 | Kritchman et al. ............. 347/20 |

FOREIGN PATENT DOCUMENTS

| KR | 10-2005-0094305 A | 9/2005 |
| KR | 10-0545975 B1 | 1/2006 |
| KR | 10-0753145 B1 | 8/2007 |
| KR | 10-2007-0121214 A | 12/2007 |
| KR | 10-0813199 B1 | 3/2008 |
| KR | 10-2008-0044775 A | 5/2008 |

* cited by examiner

*Primary Examiner* — Fernando L Toledo
*Assistant Examiner* — Valerie N Newton
(74) *Attorney, Agent, or Firm* — Christie, Parker & Hale, LLP

(57) ABSTRACT

A device for depositing an organic material includes a substrate; a mask having an opening portion and a shield portion; a fixing member for fixing the substrate and the mask to each other; a deposition source comprising a plurality of nozzles arranged in a first direction and configured to spray the organic material; and a plurality of shield plates near the plurality of nozzles on the deposition source. An angle θ between the substrate and a line extended from a distal end of one of the nozzles to a center of a distal end of a corresponding one of the shield plates is greater than or equal to a taper angle Φ of the shield portion of the mask.

13 Claims, 20 Drawing Sheets

DEVICE AND METHOD FOR DEPOSITING ORGANIC MATERIAL

CROSS-REFERENCE TO RELATED APPLICATION

This application claims priority to and the benefit of Korean Patent Application No. 10-2010-0090598 filed in the Korean Intellectual Property Office on Sep. 15, 2010, the entire content of which is incorporated herein by reference.

BACKGROUND

1. Field

The described technology relates generally to an organic material depositing device and depositing method.

2. Description of the Related Art

An organic light emitting diode (OLED) display is a flat display device that has a self emissive characteristic and does not require a separate light source, so that it can be made light in weight and thin. An OLED display exhibits quality characteristics such as low power consumption, high luminance, and fast (or high) response speed, and as such, the OLED display receives much attention as a next-generation display device.

In general, an OLED display includes an organic light emitting element that has an anode, an organic emission layer, and a cathode. Holes and electrons are injected from the anode and the cathode, respectively, to form excitons, and the excitons transition to a ground state, thereby causing the organic light emitting diode to emit light.

An organic emission layer can be formed with an organic thin film, and methods for forming the organic thin film on the substrate of the organic light emitting diode (OLED) display include the vacuum depositing method and the wet coating method. As a general method to form an organic thin film, the vacuum deposition method is used to form an organic thin film in a vapor deposition apparatus that includes an organic material evaporation source having a crucible. The organic thin film is formed by inserting a vapor deposition material in the crucible and depositing the vapor deposition material by heating the crucible to a predetermined temperature.

According to the vacuum deposition method, a mask is used to form an organic thin film pattern. The mask includes shields having a predetermined thickness, and openings for depositing a deposition material on the substrate are formed between the shields of the mask. In this instance, the deposition source moves linearly in the vacuum to output deposition material particles, and part of the deposition material particles are blocked (or intercepted) at the edge of the mask shield having a predetermined thickness, and are not deposited on the substrate. Because of the blocking influence by the shield, a shadow effect occurs, resulting in a non-uniform thickness of the organic thin film in the pixel on the substrate. The non-uniformity corresponds to the openings in the mask, and the thickness of the organic thin film at the edge of the pixel may be reduced.

When the thickness of the organic thin film deposited in the organic light emitting element is not uniformly formed, the organic light emitting element may emit light abnormally and an entire area of the organic light emitting diode (OLED) display may not provide uniform light emission.

It is not easy to change the deposition source in order to reduce or prevent the shadow effect. Further, when a taper angle of the mask shield is reduced by modifying (or improving) the form of the mask, a gap between openings of the mask may increase and a gap between the pixels may increase, such that a high-resolution organic light emitting diode (OLED) display may not be generated.

The above information disclosed in this Background section is only for enhancement of understanding of the background of the described technology. Therefore, it may contain information that does not form the prior art that is already known in this country to a person of ordinary skill in the art.

SUMMARY

Aspects of embodiments of the present invention provide an organic material depositing device for achieving (or acquiring) substantially uniform light emission over an entire area of an organic light emitting diode (OLED) display, by reducing the shadow effect and achieving (or acquiring) substantial uniformity in thickness of the organic thin film. Embodiments of the present invention relate generally to an organic material depositing device including a linear deposition source.

Another embodiment of the present invention provides an organic material depositing method for improving thickness uniformity of an organic thin film.

An exemplary embodiment provides a device for depositing an organic material, including: a substrate; a mask having an opening portion and a shield portion; a fixing member for fixing the substrate and the mask to each other; a deposition source comprising a plurality of nozzles arranged in a first direction and configured to spray the organic material; and a plurality of shield plates near the plurality of nozzles on the deposition source. An angle θ between the substrate and a line extended from a distal end of one of the nozzles to a center of a distal end of a corresponding one of the shield plates is greater than or equal to a taper angle Φ of the shield portion of the mask.

A distance t between the substrate and the plurality of nozzles may satisfy the equation $$t = \frac{n \cdot L}{2 \cdot \tan(90° - \theta)},$$

where n is a natural number and L is a distance between adjacent nozzles from among the plurality of nozzles.

The shield plates may include a first shield plate extending in the first direction and a second shield plate extending in a second direction crossing the first direction, and a height of the second shield plate that is measured in a direction from the deposition source toward the substrate may not be constant.

The second shield plate may include a pair of plates in parallel with each other, and the height of each of the plates of the pair of plates may be asymmetrically formed with respect to the center of each of the plates.

The height of the second shield plate may gradually increase or decrease along the second direction.

The shield plates may include a first shield plate formed in the first direction and a second shield plate connected to the first shield plate, and the second shield plate that is connected to the first shield plate may include a pair of plates that are not in parallel to each other.

The heights of the first and second shield plates that are measured in a direction towards the substrate from the plurality of nozzles may be substantially the same.

A distance between adjacent nozzles from among the plurality of nozzles may be constant.

A distance between adjacent nozzles from among the plurality of nozzles may not be constant.

The distance between adjacent ones of the nozzles may be reduced as an edge of the deposition source is approached.

When the distance between adjacent ones of the nozzles is reduced, the angle θ between the substrate and the line extended from the center of the distal end of one of the nozzles to the center of the distal end of a corresponding one of the shield plates may be increased.

The plurality of nozzles may be grouped into a plurality of nozzle groups arranged in the first direction, and each of the nozzle groups may be surrounded by a corresponding one of the shield plates.

The plurality of nozzles may be grouped into a plurality of nozzle groups arranged in a second direction crossing the first direction, and each of the nozzle groups may be surrounded by a corresponding one of the shield plates.

Another embodiment provides a method for depositing an organic material on a substrate including: fixing a substrate and a mask having an opening portion and a shield portion to a fixing member; providing a deposition source having a plurality of nozzles arranged in a first direction; forming a plurality of shield plates near the plurality of nozzles of the deposition source; and spraying an organic material through the plurality of nozzles while moving the deposition source in a second direction crossing the first direction. An angle θ between the substrate and a line extended from a distal end of one of the nozzles to a center of a distal end of a corresponding one of the shield plates is greater than or equal to a taper angle Φ of the shield portion of the mask.

A distance t between the substrate and the plurality of nozzles may satisfy the equation $$t = \frac{n \cdot L}{2 \cdot \tan(90° - \theta)},$$

where n is a natural number and L is a distance between adjacent nozzles from among the plurality of nozzles.

The shield plates may include a first shield plate extending in the first direction and a second shield plate extending in the second direction, and a height of the second shield plate that is measured in a direction from the deposition source toward the substrate may not be constant.

The shield plates may include a first shield plate formed in the first direction and a second shield plate connected to the first shield plate, and the second shield plate that is connected to the first shield plate may include a pair of plates that are not in parallel to each other.

A distance between adjacent nozzles from among the plurality of nozzles may be constant.

A distance between adjacent nozzles from among the plurality of nozzles may not be constant.

The method for depositing an organic material on a substrate may further include depositing the organic material on the substrate through the plurality of nozzles while moving the deposition source in the second direction; moving the deposition source in the first direction by half of a distance between adjacent nozzles of the plurality of nozzles; and depositing the organic material on the substrate through the plurality of nozzles while moving the deposition source in an opposite direction of the second direction.

According to an embodiment, substantial uniformity of the thickness of the deposited organic material can be achieved (or acquired) by reducing or preventing formation of a shadow effect in the organic material deposition process.

Also, the uniformity of the thickness of the deposited organic material may be further improved by using an overlapping effect in the organic material deposition process.

In addition, the flux of the organic material used may be reduced by improving or optimizing the disposition of a nozzle.

DETAILED DESCRIPTION

Figure 1:
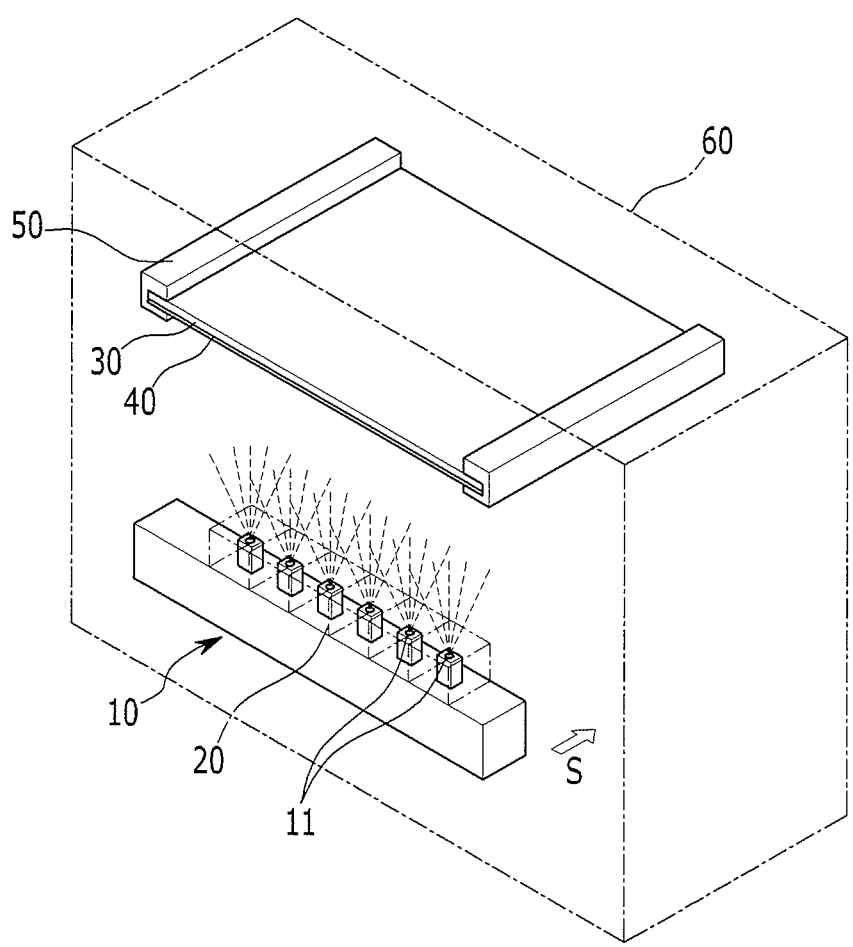
FIG. 1 shows a schematic perspective view of an organic material depositing device according to a first exemplary embodiment.

The present invention will be described more fully hereinafter with reference to the accompanying drawings, in which exemplary embodiments of the invention are shown.

The drawings and description are to be regarded as illustrative in nature and not restrictive. Like reference numerals designate like elements throughout the specification. The size and thickness of each component shown in the drawings is arbitrarily shown for understanding and ease of description, but the present invention is not limited thereto.

Figure 2:
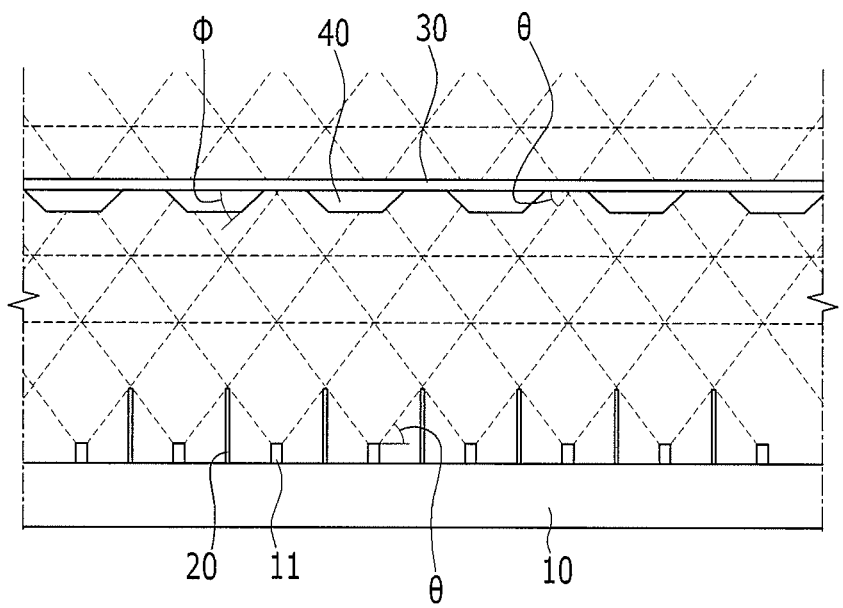
FIG. 2 schematically shows a process for depositing an organic material on a substrate using the organic material depositing device according to the first exemplary embodiment.

FIG. 1 shows a perspective view of an organic material depositing device according to a first exemplary embodiment, and FIG. 2 shows a process for depositing an organic material on a substrate using an organic material depositing device according to the first exemplary embodiment. An organic material depositing device according to a present exemplary embodiment will now be described with reference to the drawings.

Referring to FIG. 1, the organic material depositing device includes a deposition source 10, a shield plate 20, a substrate 30, a mask 40, a fixing member 50, and a process chamber 60.

The deposition source 10 for spraying an organic material on the substrate 30 includes a crucible for storing the organic material, a heater for heating the crucible to vaporize or sublimate the organic material, and a nozzle 11 connected to the crucible and configured for spraying the organic material. A plurality of nozzles 11 are arranged in series in one direction on the deposition source 10.

The substrate 30 together with the mask 40 faces the nozzles 11 of the deposition source 10 and is fixed to the fixing member 50. The mask 40 forms a pattern of the organic thin film on the substrate 30, and openings (e.g., opening portions) are formed between shield portions of the mask 40, which block (or intercept) deposition of the organic material. The mask 40 is arranged in front of the substrate 30 and faces the deposition source 10, and the organic material is deposited on the substrate 30 through the openings (e.g., opening portions) of the mask 40. The fixing member 50 attaches and arranges the substrate 30 and the mask 40, and can be adjusted (or varied) by a person of ordinary skill in the art without being restricted to the configuration of FIG. 1.

The substrate 30 is first transferred into the process chamber 60 into which the deposition source 10 and the fixing member 50 are received, and the substrate 30 is attached to the fixing member 50 together with the mask 40. The deposition process is performed when the deposition source 10 sprays the organic material while moving along the scan direction (S). While the deposition process is performed, the process chamber 60 may be maintained in a vacuum state by a vacuum pump (not shown).

The plurality of shield plates 20 are formed to surround the plurality of nozzles 11. The shield plate 20 controls the angle of the organic material sprayed towards the substrate 30 from the nozzle 11, so as to reduce the shadow effect of the organic material sprayed by the nozzle 11.

Referring to FIG. 2, since the shield plate 20 is installed near the nozzle 11 of the deposition source 10, the organic material is sprayed from the nozzle 11 towards the substrate 30 at a predetermined angle. In FIG. 2, θ represents an angle between the substrate 30 and the straight line extended from a distal end of a nozzle 11 towards the center of the distal end (or top) of a corresponding (e.g., adjacent) shield plate 20, and Φ indicates a taper angle of a shield (e.g., shield portion) of the mask 40. For better comprehension and ease of description, θ will be called a deposition angle and Φ will be referred to as a taper angle.

As described above, a shadow effect may occur as a result of (or by) the taper angle of the shield of the mask 40. Therefore, in the present exemplary embodiment, the deposition angle θ is formed to be equal to or greater than the taper angle Φ of the mask 40 so as to reduce or suppress generation of the shadow effect. When the taper angle Φ of the mask 40 is greater than the deposition angle θ, the organic material sprayed by one nozzle 11 is blocked by an edge of the shield of the mask 40 and fails to uniformly reach the entire area of one opening portion. However, when the deposition angle θ is formed to be equal to or greater than the taper angle Φ, the organic material sprayed by the nozzle 11 is not blocked by the edge of the shield portion of the mask 40 and can be substantially uniformly deposited in the opening (e.g., opening portion) of the substrate 30.

In general, the flux of the organic material that reaches the substrate after being sprayed from the nozzle depends on the deposition position of the organic material deposited on the substrate. When the horizontal distance of the deposition position measured from a nozzle is set to be x, and the distance between the substrate and the deposition source is set to be h, the flux of the organic material deposited on the substrate at the coordinates (x, h) for displaying the deposition position can be expressed as in Equation 1.

$$\text{Flux} = \left(\frac{h}{\sqrt{h^2 + x^2}}\right)^{n+3} = \cos^{n+3}(90° - \theta) \qquad \text{Equation 1}$$

Here, θ represents an angle between the substrate and the line extending between (or connecting) the nozzle and the coordinate (x, h), and n is a natural number.

Regarding the deposition form of the organic material radiated from the nozzle with reference to the equation, a large amount of organic material is deposited on the center of an opening (e.g., opening portion) of the mask corresponding to the position of a nozzle. The deposited amount is gradually reduced toward both sides of the opening (e.g., opening portion) with respect to the center, thereby generating a deposition profile similar to a Gaussian function. A shadow effect is generated because of the deposition form and the taper angle of the mask.

However, since a shield plate 20 is used in the present exemplary embodiment, the deposition form of the organic material may vary from a continuous form such as a Gaussian function to a form with a discontinuous point that is a certain distance from the nozzle (e.g., distant from the nozzle by a predetermined distance), at which the organic material is not deposited. As described above, when the shield plate 20 is used having a deposition angle θ that is equal to or greater than the taper angle Φ, the shadow effect may be reduced, but the deposition thickness of the organic material may be nonuniform because of deposition discontinuous points that are generated by usage of the shield plate 20.

Referring to FIG. 2, deposition discontinuous points may exist (or may be generated) at the points where the substrate 30 meets the dotted lines showing the boundaries of the organic material sprayed from the nozzle 11 to the substrate 30. In FIG. 2, the points where the discontinuous points meet the substrate 30 are shown as the dotted lines in parallel to the substrate 30. The non-uniformity of the thickness of the deposited organic material caused by the deposition discontinuous points can be reduced or minimized when the substrate is positioned at the points, that is, positioned at the dotted lines parallel to the substrate 30. The point at which a discontinuous point of the deposition form sprayed from a nozzle 11 meets the substrate (e.g., the shortest distance from the nozzle 11) can be given as a height t, and t can be expressed as in Equation 2.

$$t = \frac{n \cdot L}{2 \cdot \tan(90° - \theta)} \qquad \text{Equation 2}$$

Here, n is a natural number, and L represents a distance between adjacent nozzles from among a plurality of nozzles.

Figure 3A:
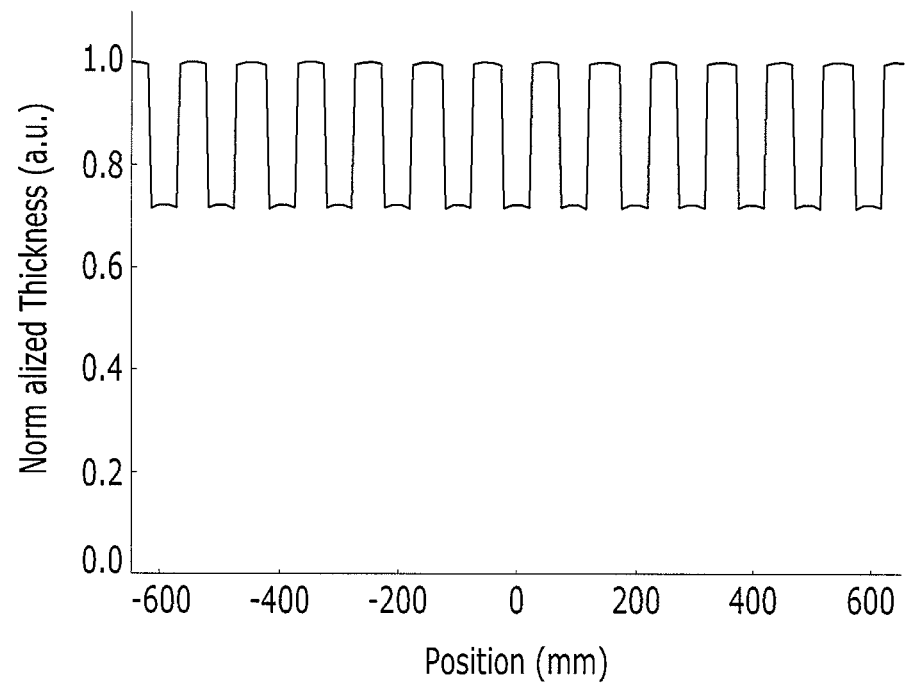
FIGS. 3A and 3B are graphs showing thickness variations of a deposited organic material, according to a distance between a substrate and a deposition source in the organic material depositing device of the first exemplary embodiment.
Figure 3B:
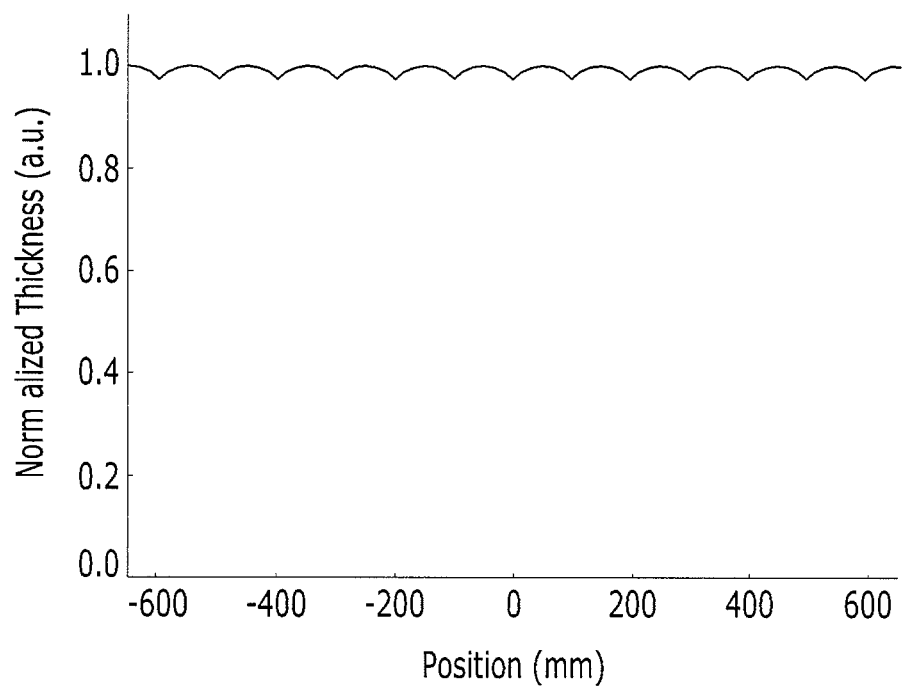

FIGS. 3A and 3B are graphs showing thickness variations of a deposited organic material according to different distances between a substrate and a deposition source in an organic material depositing device according to the first exemplary embodiment. The uniformity of the deposited thickness of the organic material according to the height of the substrate, that is, according to the distance between the substrate and the nozzle, will now be described.

Referring to FIGS. 3A and 3B, in one embodiment, the distance between the nozzles 11 is given as 100 mm, the deposition angle θ between the substrate 30 and the line extended from a distal end of a nozzle 11 towards the center of a distal end (or top) of a corresponding (e.g., adjacent) shield plate 20 is set to be 70°, and the organic material is deposited.

FIG. 3A shows variations of the thickness of the deposited organic material when the distance between the substrate 30 and the nozzle 11 is 340 mm. It is found that the deposition form of each nozzle 11 has a discontinuous point and the variation of the thickness of the deposited organic material becomes great. FIG. 3B shows variations of the thickness of the deposited organic material when the distance between the substrate 30 and the nozzle 11 is 412.1 mm. The value of 412.1 mm represents the value of t when n is given as 3 in Equation 2, and it indicates the position of the substrate in FIG. 2. Referring to FIG. 3B, the deposited discontinuous points of the nozzles 11 overlap, so the variations of the thickness of the deposited organic material are improved compared to the case of FIG. 3A.

Accordingly, the distance between the substrate 30, on which the organic material is deposited, and the nozzle 11 of the deposition source 10 can be controlled (e.g., set at a predetermined value) in the present exemplary embodiment, thereby providing a substantially uniform thickness of the deposited organic material.

It is possible in the present exemplary embodiment to control the thickness of the organic material deposited to be further uniform by changing the form of the shield plate. A shield plate of an organic material depositing device according to an exemplary embodiment will now be described with reference to FIGS. 4A to 6.

Figure 4A:
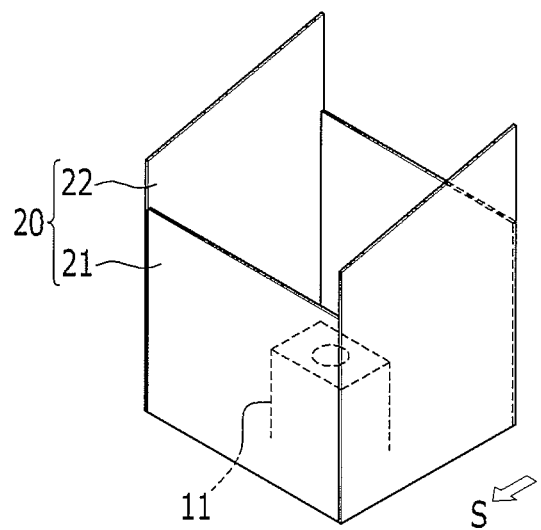
FIG. 4A shows a perspective view of a shield plate according to the first exemplary embodiment.
Figure 4B:
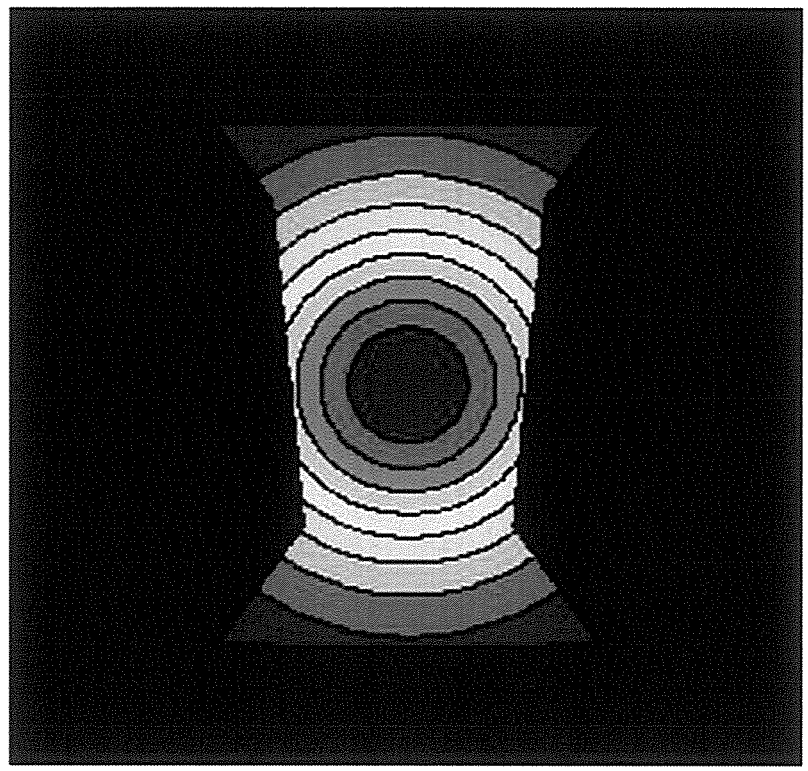
FIG. 4B shows a deposition profile of an organic material that is deposited when an organic material depositing device according to the first exemplary embodiment is stopped.
Figure 4C:
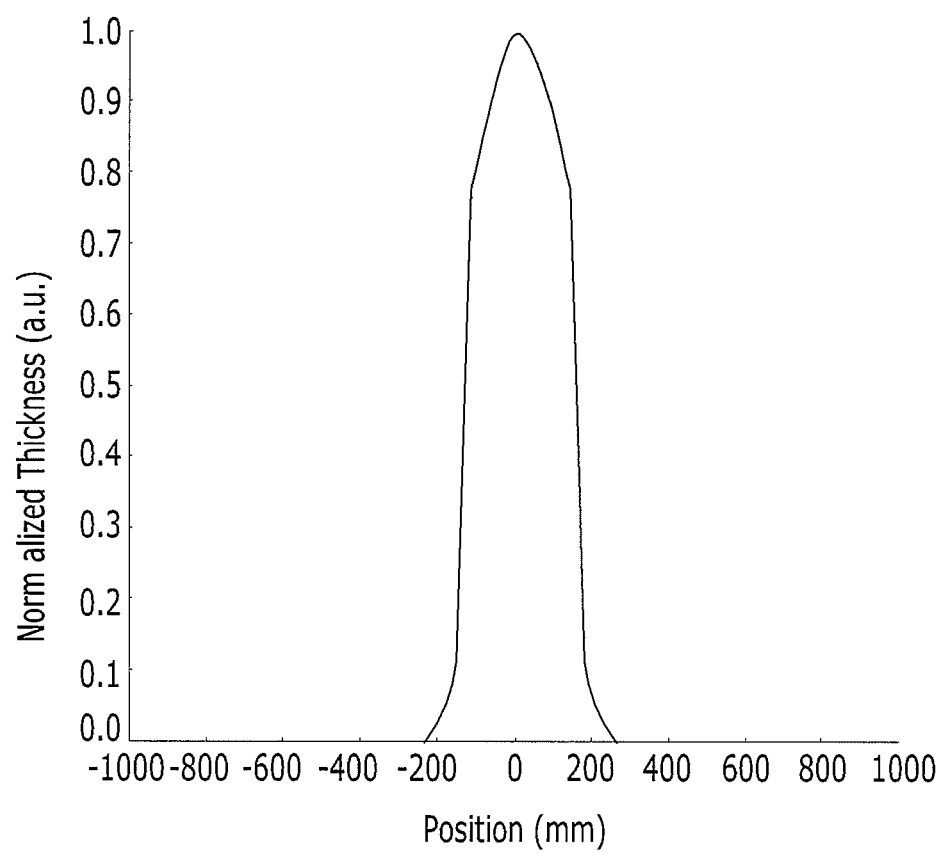
FIG. 4C shows a deposition profile of an organic material that is deposited while an organic material depositing device according to the first exemplary embodiment is moving.
Figure 5A:
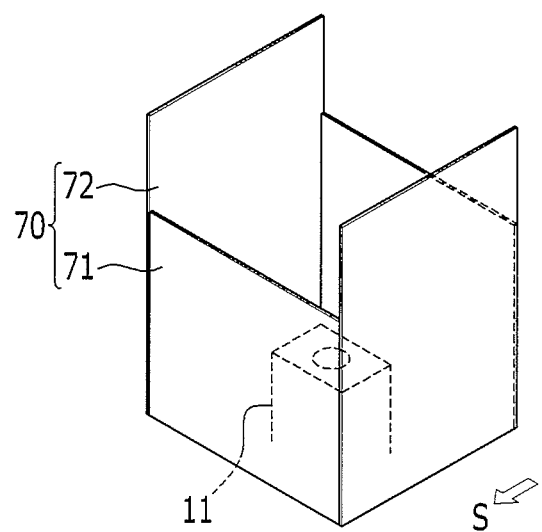
FIG. 5A shows a perspective view of a shield plate according to a comparative example of the present invention.
Figure 5B:
FIG. 5B shows a deposition profile of an organic material that is deposited when an organic material depositing device according to the comparative example of FIG. 5A is stopped.
Figure 5B:
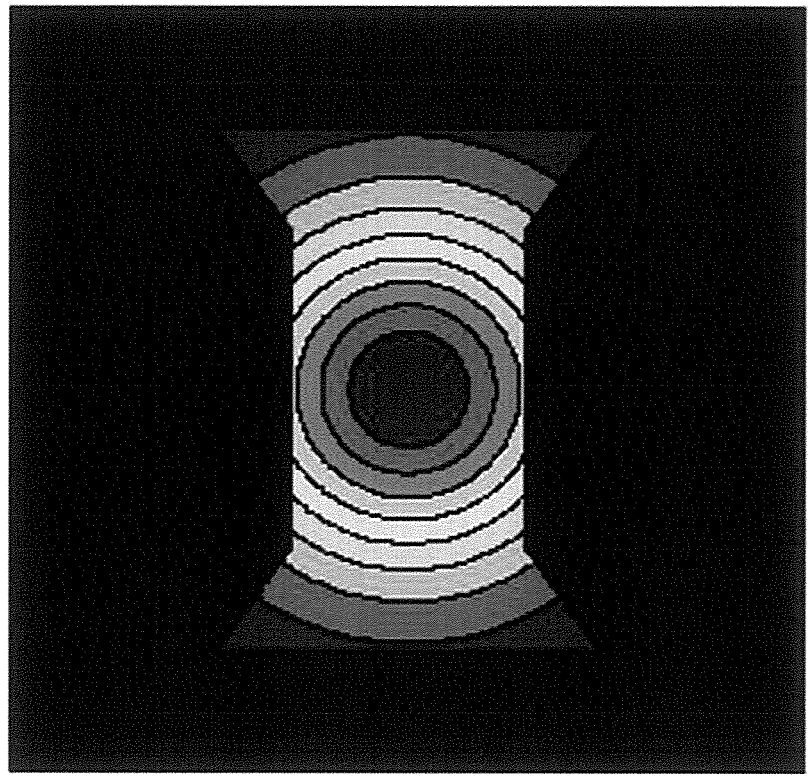
Figure 5C:
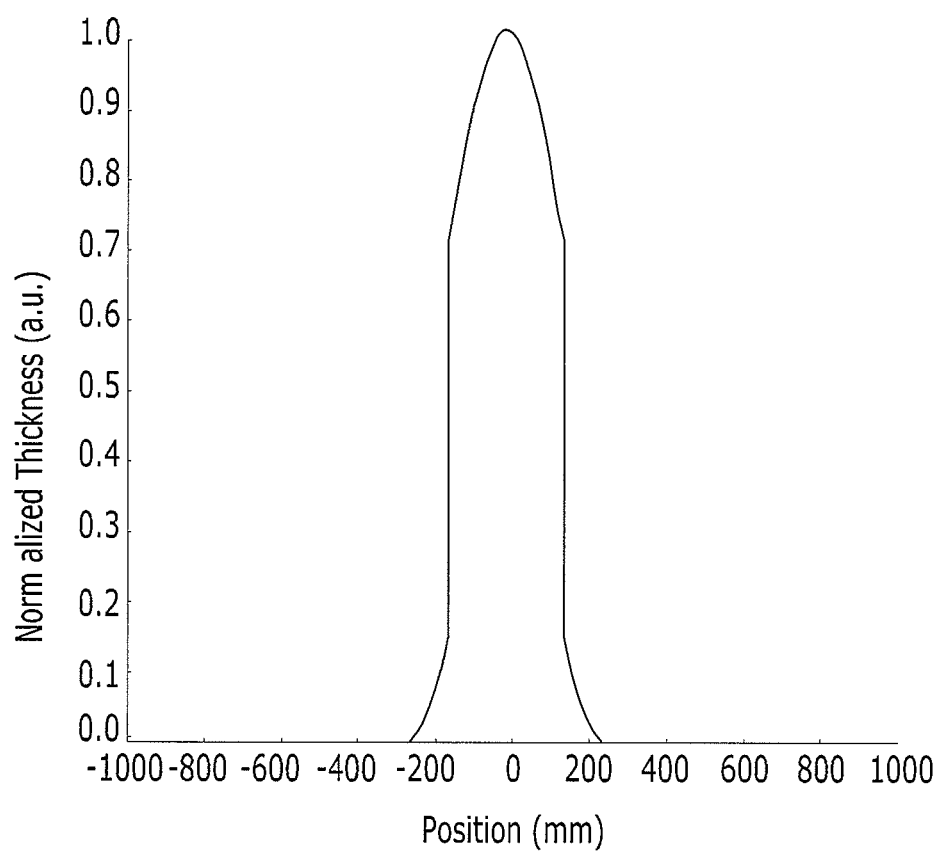
FIG. 5C shows a deposition profile of an organic material that is deposited while an organic material depositing device according to the comparative example of FIG. 5A is moving.

FIG. 4A shows a perspective view of a shield plate according to the first exemplary embodiment, FIG. 4B shows a deposition profile of an organic material that is deposited when an organic material depositing device according to the first exemplary embodiment is stopped, and FIG. 4C shows a deposition profile of an organic material that is deposited while an organic material depositing device according to the first exemplary embodiment is moving. Also, FIG. 5A shows a perspective view of a shield plate according to a comparative example of the present invention; FIG. 5B shows a deposition profile of an organic material that is deposited when an organic material depositing device according to the comparative example of the present invention is stopped; and FIG. 5C shows a deposition profile of an organic material that is deposited while an organic material depositing device according to the comparative example of the present invention is moving. A shield plate of an organic material depositing device according to a first exemplary embodiment will be described in comparison with the comparative example.

Referring to FIG. 4A, the shield plate 20 is formed to surround the nozzle 11. The shield plate 20 includes a first shield plate 21 that is perpendicular to the scan direction (S) of the deposition source and a second shield plate 22 that is parallel to the scan direction (S) of the deposition source. The first shield plate 21 and the second shield plate 22 are each formed as a pair of flat plates in parallel with each other. A deposition angle of the first shield plate 21 is formed to be 50°, and the deposition angle of the second shield plate 22 is formed to be 70°.

The first shield plate 21 is formed to be rectangular while the second shield plate 22 is formed to be trapezoidal. That is, the second shield plate 22 does not have a constant height, and its height is asymmetrically formed with respect to the line connected to the center of the adjacent nozzle 11. In the present exemplary embodiment, the height of the second shield plate 22 is shown to be gradually decreased moving along the scan direction (S) of the deposition source, but it can also be formed to be gradually increased in the scan direction (S) of the deposition source. The height of the shield plate represents the length of the shield plate measured in a direction towards the substrate from the nozzle.

Referring to FIG. 5A, in the comparative example, a shield plate 70 surrounding the nozzle 11 includes a first shield plate 71 and a second shield plate 72, and the first shield plate 71 and the second shield plate 72 are each formed to be rectangular with a constant height. Also, the deposition angle of the first shield plate 71 is formed to be 50° and the deposition angle of the second shield plate 72 is formed to be 70°.

Referring to FIG. 4B, when the organic material is sprayed from the nozzle 11 while the shield plate 20 according to the presented embodiment is stopped, a deposition profile can be formed in which the width of the deposition area of the organic material is widened (e.g., a little bit widened) along the scan direction (S). By contrast, according to the comparative example in FIG. 5B, when the organic material is sprayed from the nozzle 11 while the shield plate 70 is stopped, a deposition profile in which the width of the deposition area of the organic material is constant along the scan direction (S) is formed. That is, the height of the second shield plate 22 perpendicular to the scan direction (S) in FIG. 4A is formed to be not constant in the present exemplary embodiment. Thus, the width of the deposition area of the organic material shown in FIG. 4B is not constant along the scan direction (S). In FIGS. 4B and 5B, the contours represent a thickness of the deposited organic material, which increases as it approaches the center.

The deposition profiles of FIGS. 4C and 5C are obtained (or acquired) by summing the thicknesses of the organic material deposited in the scan direction (S) in the stopped deposition profile. When the organic material is deposited while moving the deposition source with the shield plate 70 in the scan direction (S) according to the comparative example, a discontinuous section that distinguishes the deposition area and the non-deposition area is formed (or clearly formed) (refer to FIG. 5C). However, when the organic material is deposited while moving the deposition source with the shield plate 20 in the scan direction (S) according to the present exemplary embodiment, no discontinuous point is found in which the deposition area and the non-deposition area are distinguished, and an improved deposition profile (e.g., a deposition profile that is a little eased) is formed (refer to FIG. 4C).

Figure 6:
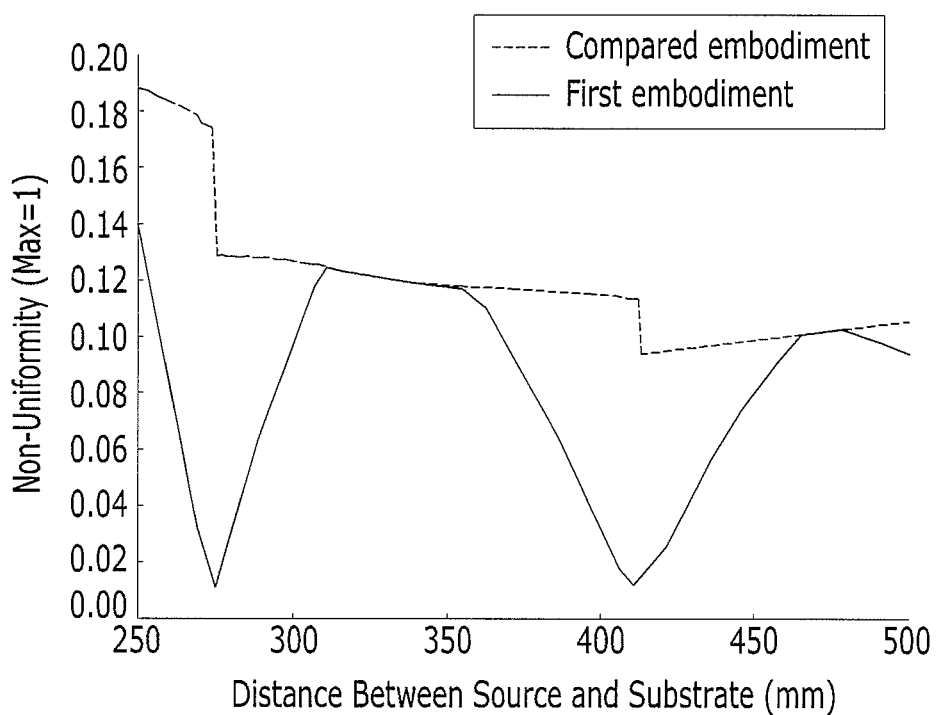
FIG. 6 shows a graph of variations in non-uniformity according to different distances between a substrate and a deposition source, when shield plates according to the comparative example of FIG. 5A and the first exemplary embodiment are used.

FIG. 6 shows a graph of variations of non-uniformity according to different distances between a substrate and a deposition source, when a shield plate according to a comparative example is used and when a shield plate according to a first exemplary embodiment is used.

Referring to FIG. 6, in the organic material depositing device using the shield plate 70 according to the comparative example, the non-uniformity of the thickness of the deposited organic material is greater than about 0.10 when the distance between the substrate and the deposition source is varied. However, in the organic material depositing device using the shield plate 20 according to the present exemplary embodiment, the non-uniformity of the thickness of the deposited organic material substantially varies depending on the distance between the substrate and the deposition source, and the non-uniformity of the thickness of the organic material at (or near) the distance (height of the substrate) determined by (or acquired through) Equation 2 is substantially reduced. That is, when the height t of the substrate is about 274.7 mm (n=2) or 412.1 mm (n=3), the non-uniformity of the thickness of the deposited organic material is substantially reduced. Also, the area of the substrate with low non-uniformity of the thickness of the deposited organic material is relatively wide.

It is found therefore that the discontinuous point of the organic material that is sprayed from one nozzle 11 and then deposited on the substrate can be reduced or eliminated by modifying (or transforming) the form of the shield plate 20 in the present exemplary embodiment. For example, the form of the second shield plate 22 in parallel to the scan direction (S) of the deposition source can be modified and the uniformity of the thickness of the deposited organic material improved by arranging the substrate and the deposition source at a specific distance from each other. Further, if the height of the substrate is slightly changed by an error during the process, the uniformity of the thickness of the deposited organic material is not worsened but maintains an appropriate level.

As described above, in the present exemplary embodiment, the deposition angle θ of the shield plate is formed to be equal to or greater than the taper angle Φ of the mask to reduce or suppress the shadow effect, and the distance between the substrate and the deposition source can be controlled to reduce or remove the discontinuous point of the deposition profile caused by usage of the shield plate. In addition, the uniformity of the thickness of the deposited organic material can be further improved by changing the form of the shield plate. Since an organic thin film with a substantially uniform thickness can be formed when the organic material is deposited with a substantially uniform thickness, substantially uniform light emission can be achieved (or acquired) on the entire area of the organic light emitting diode (OLED) display.

An organic material depositing device according to an exemplary variation of a first exemplary embodiment will now be described with reference to FIGS. 7A to 7D.

Figure 7A:
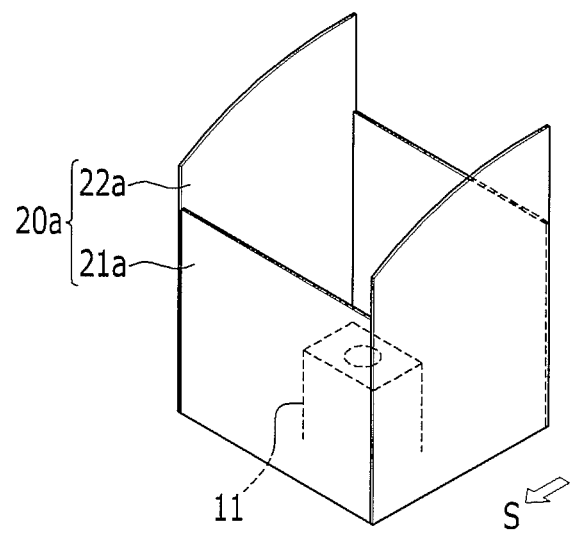
FIG. 7A shows a perspective view of a shield plate of an organic material depositing device according to a first exemplary variation of the first exemplary embodiment.

FIG. 7A shows a perspective view of a shield plate of an organic material depositing device according to a first exemplary variation of the first exemplary embodiment. Referring to FIG. 7A, a shield plate 20a according to the first exemplary variation includes a first shield plate 21a perpendicular to the scan direction (S) of the deposition source nozzle 11 and a second shield plate 22a in parallel to the scan direction (S) of the deposition source nozzle 11. The first shield plate 21a is formed to be rectangular with a constant height, and the second shield plate 22a is formed to have a convex parabola in the scan direction (S) at the top of the plate. The discontinuous point of the organic material sprayed from one nozzle 11 and deposited on the substrate can be reduced or removed by changing the form of the shield plate 20a as described, thereby controlling the thickness of the deposited organic material to be substantially uniform.

Figure 7B:
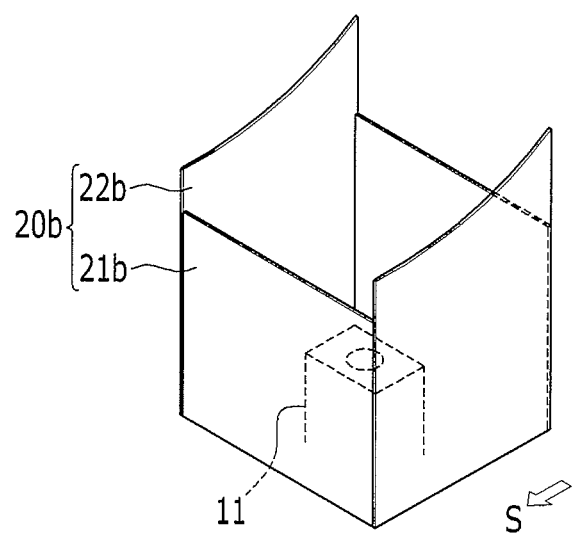
FIG. 7B shows a perspective view of a shield plate of an organic material depositing device according to a second exemplary variation of the first exemplary embodiment.

FIG. 7B shows a perspective view of a shield plate of an organic material depositing device according to a second exemplary variation of the first exemplary embodiment. Referring to FIG. 7B, the shield plate 20b according to the second exemplary variation includes a first shield plate 21b perpendicular to the scan direction (S) of the deposition source nozzle 11 and a second shield plate 22b in parallel to the scan direction (S) of the deposition source nozzle 11. The first shield plate 21b is formed to be rectangular with a constant height, and the second shield plate 22b is formed to be concave in the scan direction (S). The discontinuous point of the organic material sprayed from one nozzle 11 and deposited can be reduced or eliminated by modifying (or transforming) the shield plate 20b, thereby controlling the thickness of the deposited organic material to be substantially uniform.

Accordingly, the form of the shield plate can be varied into many forms so as to reduce or remove the discontinuous point of the organic material sprayed by one nozzle and deposited on the substrate. For example, it will be sufficient when the height of the shield plate in parallel to the scan direction of the deposition source is formed to be not constant, and it will be desirable to form the same to be asymmetric with respect to the center of the shield plate. Also, it will be sufficient to form the deposition angle to be equal to or greater than the taper angle of the mask, and it will also be possible to vary (or change) the deposition angle of 50° or 70° exemplified in the first exemplary embodiment.

Figure 7C:
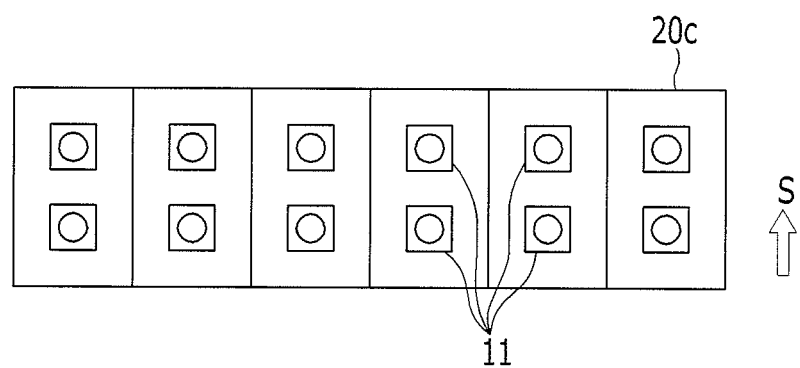
FIG. 7C shows a top plan view of a deposition source and a shield plate of an organic material depositing device according to a third exemplary variation of the first exemplary embodiment.

FIG. 7C shows a top plan view of a deposition source and a shield plate of an organic material depositing device according to a third exemplary variation of the first exemplary embodiment. Referring to FIG. 7C, the deposition source nozzles 11 according to the third exemplary variation are classified into a plurality of nozzle groups in pairs in the scan direction (S) of the deposition source. The nozzle groups are arranged in the length direction of the deposition source, and one shield plate 20c is formed to surround a corresponding one of the nozzle groups.

Figure 7D:
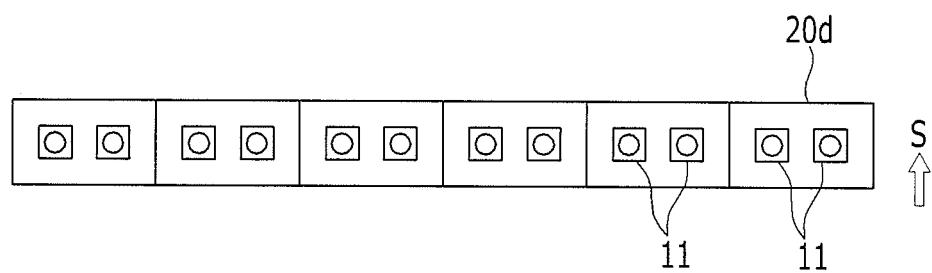
FIG. 7D shows a top plan view of a deposition source and a shield plate of an organic material depositing device according to a fourth exemplary variation of the first exemplary embodiment.

FIG. 7D shows a top plan view of a deposition source and a shield plate of an organic material depositing device according to a fourth exemplary variation of the first exemplary embodiment. Referring to FIG. 7D, a plurality of deposition source nozzles 11 according to the fourth exemplary variation are classified as a plurality of nozzle groups in pairs in the width direction of the deposition source and not parallel to the scan direction (S). The nozzle groups are arranged in the width direction of the deposition source, and one shield plate 20d is formed to surround a corresponding one of the nozzle groups.

As described in the third exemplary variation and the fourth exemplary variation, in the present exemplary embodiment one shield plate is formed to surround a corresponding nozzle group including two nozzles. Also, one nozzle group may include more than two nozzles, and one shield plate may surround a corresponding one of the nozzle groups, depending on the size of the deposition target, the purpose of deposition, and process conditions.

Another exemplary embodiment will now be described. The same configurations as in the first exemplary embodiment will be briefly described or omitted.

Figure 8:
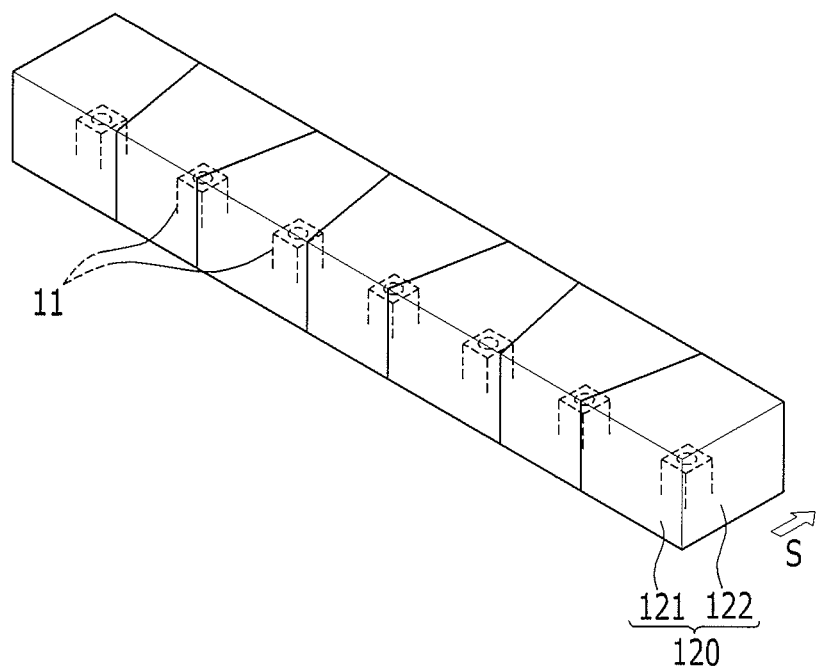
FIG. 8 shows a perspective view of a shield plate of an organic material depositing device according to a second exemplary embodiment.
Figure 9:
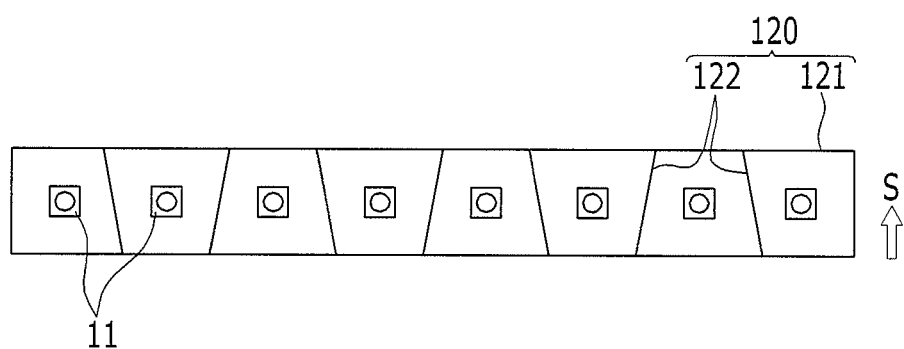
FIG. 9 shows a top plan view of a deposition source and a shield plate of an organic material depositing device according to the second exemplary embodiment.
Figure 10:
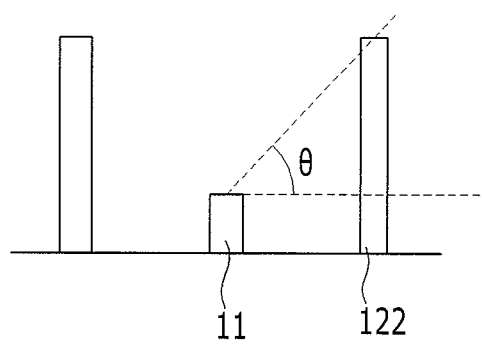
FIG. 10 shows a side view of a nozzle and a shield plate of an organic material depositing device according to the second exemplary embodiment.

FIG. 8 shows a perspective view of a shield plate of an organic material depositing device according to a second exemplary embodiment, FIG. 9 shows a top plan view of a deposition source and a shield plate of an organic material depositing device according to the second exemplary embodiment, and FIG. 10 shows a side view of a nozzle and a shield plate of an organic material depositing device according to the second exemplary embodiment.

Referring to FIGS. 8 and 9, a plurality of nozzles 11 are arranged in series in a direction perpendicular to the length direction of the deposition source, that is, perpendicular to the scan direction (S) of the deposition source, and a shield plate 120 is formed to surround a corresponding one of the nozzles 11. The shield plate 120 includes a first shield plate 121 perpendicular to the scan direction (S) of the deposition source and a second shield plate 122 connected to (or crossing) the first shield plate 121.

In the present exemplary embodiment, in contrast to the first exemplary embodiment, the first shield plate 121 and the second shield plate 122 are each formed to be rectangular and have a constant height. Also, the second shield plate 122 is not formed to be in parallel to the scan direction (S) of the deposition source, but is formed to be oblique with a predetermined slope. Accordingly, referring to FIG. 9, a pair of first shield plates 121 are formed to be in parallel, and a pair of the second shield plates 122 contacts the first shield plates 121 at a predetermined angle therebetween, that is different from 90 degrees, so that the flat form of the shield plate 120 surrounding one nozzle 11 is formed to be trapezoidal.

FIG. 10 shows one nozzle 11 with second shield plates 122 on both sides thereof. The organic material sprayed from the nozzle 11 is deposited on the substrate at a deposition angle θ (e.g., a predetermined deposition angle θ). In this instance, the deposition angle θ represents an angle between the substrate and the line extended from a distal end of a nozzle 11 to the top center of a corresponding (e.g., adjacent) second shield plate 122. In order to reduce or suppress the shadow effect caused by the mask in the present exemplary embodiment, the deposition angle θ is formed to be equal to or greater than the taper angle of the mask.

Accordingly, in the present exemplary embodiment, the height of the second shield plate 122 may be formed to be a certain height, and the organic material deposition profile may be formed as shown in FIG. 4B by forming the second shield plate 122 to be oblique with respect to the first shield plate 121. Therefore, when the deposition source is moved in the scan direction (S) and the organic material is deposited, a deposition profile not having a discontinuous point may be formed as shown in FIG. 4C.

As a result, the discontinuous point of the deposited organic material caused by the form of the shield plate of the material depositing device according to the present exemplary embodiment, can be reduced or removed, thereby further improving the uniformity of the thickness of the deposited organic material.

Figure 11:
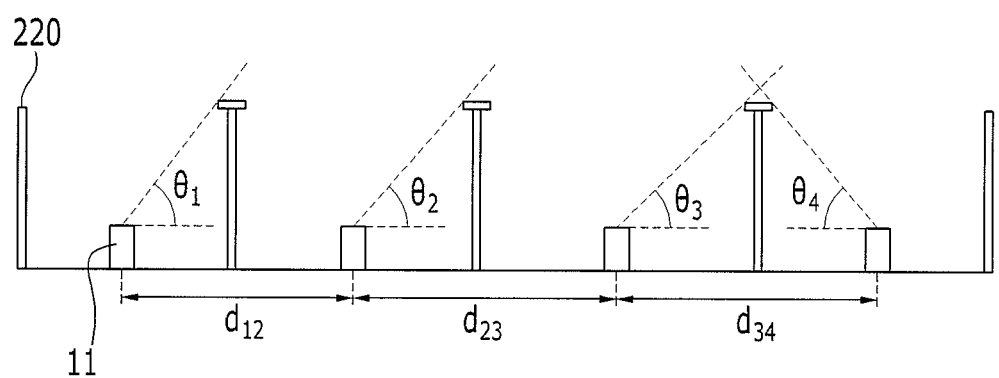
FIG. 11 shows a side view of a nozzle and a shield plate of an organic material depositing device according to a third exemplary embodiment.

FIG. 11 shows a side view of a nozzle and a shield plate of an organic material depositing device according to a third exemplary embodiment.

Referring to FIG. 11, in the organic material depositing device according to the present exemplary embodiment, the nozzles 11 of the deposition source are arranged in series and perpendicular to the length direction of the deposition source, and the distances $d_{12}$, $d_{23}$, and $d_{34}$ among the adjacent nozzles 11 are formed to be different from one another. In general, when a linear deposition source is used, the thickness of the organic material that is deposited in the center of the substrate may be formed to be greater than the thickness of the organic material that is deposited on the edge of the substrate, and in order to compensate for this, it is possible to adjust (or form) the distance between the adjacent nozzles to be narrower toward the edge of the deposition source from the center thereof.

As described above, when the distance between the nozzles and the deposition angle are set, the height of the substrate, that is, the distance between the substrate and the deposition source, can be improved or optimized so as to improve the uniformity of the thickness of the deposited organic material. In the present exemplary embodiment, when the respective constituent elements of the organic material depositing device are formed and disposed, it should be considered that the distance between the adjacent nozzles 11 may not be constant.

Referring to Equation 2, the distance t between the substrate and the nozzles of the deposition source, the distance L between the adjacent nozzles, and the deposition angle θ have a relationship therebetween. Since the distance between adjacent nozzles 11 is not constant and the corresponding height of the substrate for each nozzle 11 cannot be changed in the present exemplary embodiment, the thickness of the deposited organic material in an exemplary embodiment can be controlled to be substantially uniform by changing the deposition angle between the nozzle 11, and the shield plate 220 surrounding the nozzle 11, according to the distance between the adjacent nozzles 11.

For example, when the distance between the adjacent nozzles 11 becomes small (or narrow), the deposition angle caused by the shield plate 220 increases, and when the distance between the adjacent nozzles 11 becomes large (or wide), the deposition angle caused by the shield plate 220 decreases. In this instance, as shown in FIG. 11, it is possible to control the deposition angle by forming a blocking member on the shield plate 220 or by modifying (or controlling) the thickness of the shield plate.

For example, in the case shown in FIG. 11, when the distances $d_{12}$, $d_{23}$, and $d_{34}$ between the adjacent nozzles 11 are 95 mm, 100 mm, and 105 mm, respectively, the height of the substrate (or the distance between the substrate and the nozzle) is 412.1 mm. The uniformity of the thickness of the deposited organic material is improved or optimized when the deposition angles $\theta_1$, $\theta_2$, $\theta_3$, and $\theta_4$ are formed to be 19.07°, 20°, 20°, and 20.92°, respectively.

Accordingly, an organic material depositing device according to the present exemplary embodiment has different distances between the nozzles according to the position of the deposition source, so as to uniformly form the thickness of the deposited organic material in the center of the substrate and at the edge thereof. As such, the uniformity of the thickness of the deposited organic material may be improved by controlling the deposition angle.

FIGS. 12A to 12D sequentially show a method for depositing an organic material according to an exemplary embodiment. A method for depositing an organic material on the substrate by using an organic material depositing device according to an exemplary embodiment will now be described.

An organic material depositing method according to the present exemplary embodiment uses the organic material depositing device according to the first through the third exemplary embodiments. In the organic material depositing device, the nozzles 11 are arranged on the deposition source in series and perpendicular to the length direction of the deposition source, and the shield plate 20 is formed to surround a corresponding one of the nozzles 11. Further, the deposition angle of the shield plate from the nozzle of the deposition source is formed to be equal to or greater than the taper angle of the mask. The distance between the substrate and the nozzle of the deposition source can be set at a value (or optimal value) according to Equation 2, and the form of the shield plate can be varied in many ways.

As described above, the organic material sprayed from one nozzle has a deposition profile having a discontinuous point, and when adjacent nozzles are closely formed by reducing the distance therebetween, the discontinuous point may be reduced or removed, thereby improving the uniformity of the thickness of the deposited organic material. However, when the distance between adjacent nozzles is reduced, the distance between the nozzle and the shield plate adjacent to the nozzle is also reduced, which may cause problems such as blocking of the nozzle or changing of the angle of the shield plate when the thick organic material sprayed by the nozzle is deposited on the shield plate.

In consideration of the problems in the present exemplary embodiment, the uniformity of the thickness of the organic material deposited may be improved through overlapped deposition.

Figure 12A:
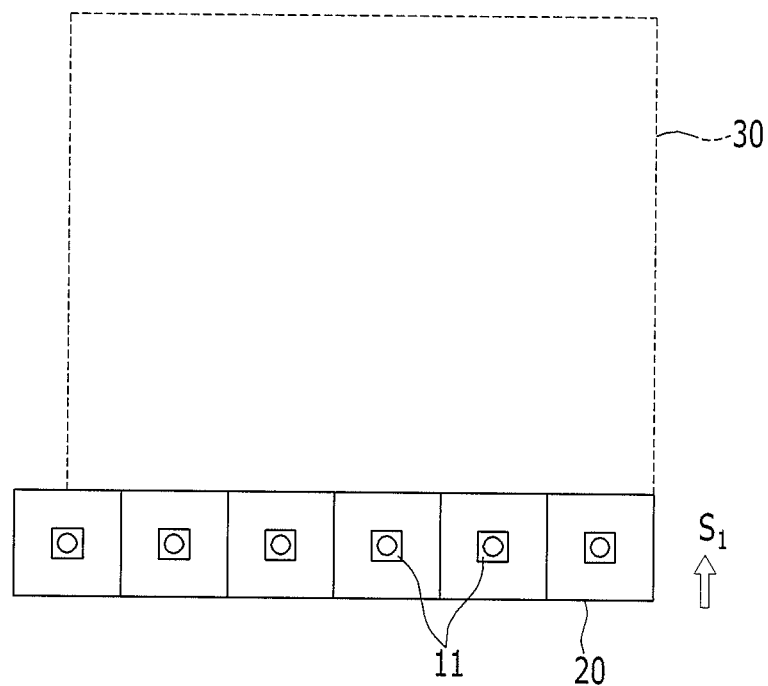
FIGS. 12A to 12D sequentially show a method for depositing an organic material according to an exemplary embodiment.
Figure 12B:
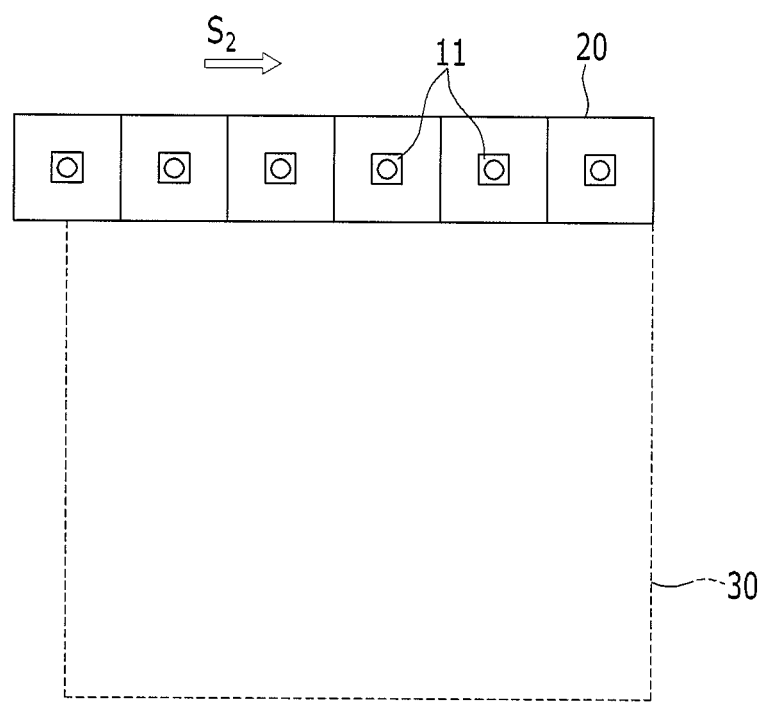
Figure 12C:
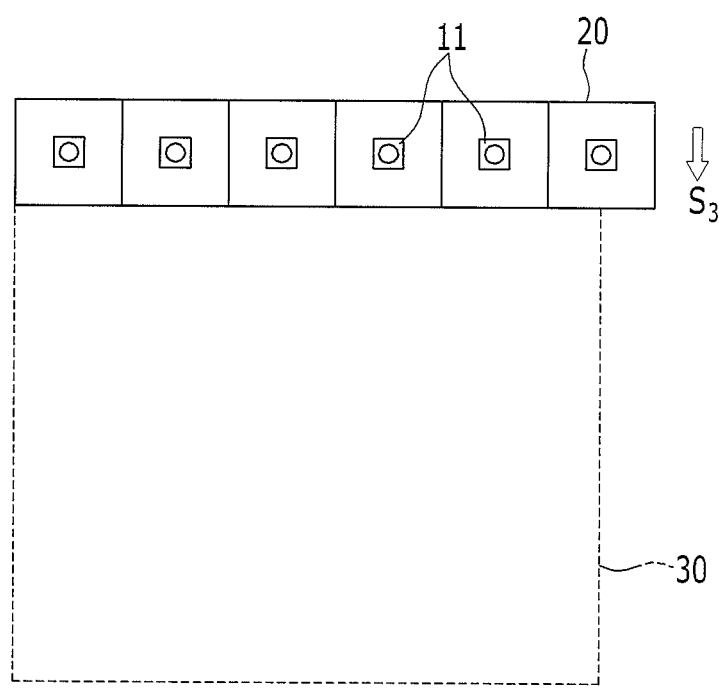
Figure 12D:
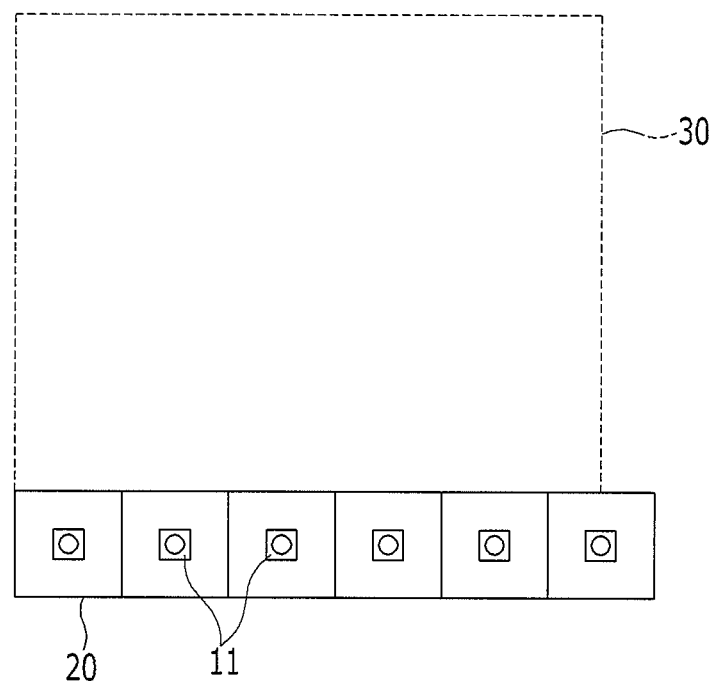

Regarding the overlapped deposition process, the deposition source is disposed in parallel to one side of the substrate 30 and is moved in a first direction $S_1$ to deposit an organic material on the substrate 30 (refer to FIG. 12A). The deposition source is then moved to a position that corresponds to another side of the substrate 30, and is shifted (or moved) in a second direction $S_2$ crossing the first direction $S_1$, by half of the distance between a pair of adjacent nozzles 11 (refer to FIG. 12B). The deposition source is then moved in a third direction $S_3$ that is opposite to the first direction $S_1$ to deposit the organic material on the substrate 30 (refer to FIG. 12C). The deposition source is then moved to the position corresponding to the one side of the substrate 30, and the deposition is then stopped.

According to the organic material depositing method, the uniformity of the thickness of the organic material deposited by overlapped deposition may be improved. Further, the shadow effect may be reduced or suppressed by using the described organic material depositing device.

Also, in the present exemplary embodiment, the organic material may be deposited on the substrate by moving the deposition source through three stages. The deposition source can be moved once in a first direction to deposit the organic material, depending on the size of the target to be deposited, deposition usage, and process conditions. In addition, the organic material may be further deposited (e.g., closely deposited) by adding an overlapped deposition process, including a process for moving the deposition source in a second direction by ¼ of the distance between adjacent nozzles, between the stages of the process for depositing the organic material.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. A device for depositing an organic material, comprising:
a substrate;
a mask having an opening portion and a shield portion;
a fixing member for fixing the substrate and the mask to each other;
a deposition source comprising a plurality of nozzles arranged in a first direction and configured to spray the organic material; and
a plurality of shield plates near the plurality of nozzles on the deposition source, wherein
an angle θ between the substrate and a line extended from a distal end of one of the nozzles to a center of a distal end of a corresponding one of the shield plates is greater than or equal to a taper angle Φ of the shield portion of the mask.

2. The device of claim 1, wherein:
a distance t between the substrate and the plurality of nozzles satisfies the equation $$t = \frac{n \cdot L}{2 \cdot \tan(90° - \theta)}$$

where n is a natural number and L is a distance between adjacent nozzles from among the plurality of nozzles.

3. The device of claim 1, wherein:
the shield plates comprise a first shield plate extending in the first direction and a second shield plate extending in a second direction crossing the first direction, and wherein
a height of the second shield plate that is measured in a direction from the deposition source toward the substrate is not constant.

4. The device of claim 3, wherein:
the second shield plate comprises a pair of plates in parallel with each other, and wherein
the height of each of the plates of the pair of plates is asymmetrically formed with respect to the center of each of the plates.

5. The device of claim 3, wherein:
the height of the second shield plate gradually increases or decreases along the second direction.

6. The device of claim 1, wherein:
the shield plates comprise a first shield plate formed in the first direction and a second shield plate connected to the first shield plate, and wherein
the second shield plate that is connected to the first shield plate comprises a pair of plates that are not in parallel to each other.

7. The device of claim 6, wherein:
the heights of the first and second shield plates that are measured in a direction towards the substrate from the plurality of nozzles are substantially the same.

8. The device of claim 1, wherein:
a distance between adjacent nozzles from among the plurality of nozzles is constant.

9. The device of claim 1, wherein:
a distance between adjacent nozzles from among the plurality of nozzles is not constant.

10. The device of claim 9, wherein:
the distance between adjacent ones of the nozzles is reduced as an edge of the deposition source is approached.

11. The device of claim 9, wherein:
when the distance between adjacent ones of the nozzles is reduced, the angle θ between the substrate and the line extended from the center of the distal end of one of the nozzles to the center of the distal end of a corresponding one of the shield plates is increased.

12. The device of claim 1, wherein:

the plurality of nozzles are grouped into a plurality of nozzle groups arranged in the first direction, and wherein each of the nozzle groups is surrounded by a corresponding one of the shield plates.

13. The device of claim 1, wherein:

the plurality of nozzles are grouped into a plurality of nozzle groups arranged in a second direction crossing the first direction, and wherein each of the nozzle groups is surrounded by a corresponding one of the shield plates.

\* \* \* \* \*